United States Patent
Lee (10) Patent No.: US 7,701,770 B2
(45) Date of Patent: Apr. 20, 2010

(54) FLASH MEMORY DEVICE AND PROGRAM METHOD THEREOF

(75) Inventor: Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 207 days.

(21) Appl. No.: 11/856,699

(22) Filed: Sep. 17, 2007

(65) Prior Publication Data

US 2008/0080250 A1 Apr. 3, 2008

(30) Foreign Application Priority Data

Sep. 29, 2006 (KR) .................. 10-2006-0096007
Jun. 27, 2007 (KR) .................. 10-2007-0063576

(51) Int. Cl.
*G11C 16/04* (2006.01)
(52) U.S. Cl. .................. 365/185.18; 365/189.07; 365/185.03
(58) Field of Classification Search ............ 365/185.18, 365/189.07, 185.03
See application file for complete search history.

(56) References Cited

U.S. PATENT DOCUMENTS

| 7,336,538 | B2 * | 2/2008 | Crippa et al. | 365/185.12 |
| 7,408,806 | B2 * | 8/2008 | Park et al. | 365/185.17 |
| 7,480,179 | B2 * | 1/2009 | Li | 365/185.17 |
| 7,489,549 | B2 * | 2/2009 | Mokhlesi | 365/185.18 |
| 2005/0018488 | A1 | 1/2005 | Kim et al. | |
| 2009/0097319 | A1 * | 4/2009 | Sekar et al. | 365/185.17 |
| 2009/0103356 | A1 * | 4/2009 | Mokhlesi | 365/185.02 |
| 2009/0285024 | A1 * | 11/2009 | Kang | 365/185.03 |

FOREIGN PATENT DOCUMENTS

| KR | 1020030081623 A | 10/2003 |
| KR | 10-2005-0007653 A | 1/2005 |

* cited by examiner

*Primary Examiner*—Tuan T. Nguyen
(74) *Attorney, Agent, or Firm*—Townsend and Townsend and Crew LLP

(57) ABSTRACT

A method of programming a flash memory device including performing a first program for programming cells to a first state and a second state higher than the first state, and performing a second program simultaneously together with the first program, for programming cells to the second state and a third state higher than the second state.

12 Claims, 6 Drawing Sheets

FIG. 1A erase step

FIG. 1B

LSB program step

FIG. 1C first MSB program step

FIG. 1D second MSB program step

FLASH MEMORY DEVICE AND PROGRAM METHOD THEREOF

CROSS-REFERENCE TO RELATED APPLICATIONS

This application claims priority from Korean Patent Application No. 2006-96007, filed on Sep. 29, 2006 and Korean Patent Application No. 2007-63576, filed on Jun. 27, 2007, the contents of which are incorporated herein by reference in its entirety.

BACKGROUND OF THE INVENTION

The present invention relates to a flash memory device a program method thereof, and more particularly, to a flash memory device and program method capable of increasing a programming speed.

Generally, a flash memory device includes an insulating layer, a floating gate, a dielectric layer and a control gate, which are laminated on a semiconductor substrate. The floating gate is used as a charge storing layer, and the details thereof will be described.

When a program voltage is applied to a control gate through a selected word line, a Fowler-Nordheim (F-N) tunneling phenomenon is produced between a semiconductor substrate and a floating gate, and thus electrons flow into the floating gate from the semiconductor substrate to perform a program operation.

A floating gate storing electrons becomes a programmed cell to be higher in a voltage than a threshold voltage of an erase, and thus the programmed cell can be distinguished from the erase cell by reading this distribution difference of a threshold voltage.

A flash memory device has two states, for example, an erase state or a programmed state, and the memory device driven in one erase state and one programmed state refers to as a single level chip ("SLC"). In the other hands, a programming method of each memory cell in multi-level to store much more data than the single line chip SLC has been developed, which is referred to as a multi level chip ("MLC"). The multi line chip MLC is operated in a way of defining each data state which is different each other in respective distribution intervals of the threshold voltage. More details thereof will be described.

For example, when data is stored on the multi line chip MLC, the states that one memory cell may have can be sorted into an erase state, a PV1 state, a PV2 state and PV3 state. Here, assuming that the PV1 state is the programmed state with the lowest interval among the programmed threshold voltage intervals, the PV2 state is higher in threshold distributions than the PV1 state, and the PV3 state is higher than the PV2 state. Like this, with respect to the respective threshold voltage intervals, data of multi bit (i.e., 11, 01, 00 and 01) may be defined in sequence. In the following, a description thereof will be made with reference to FIG. 1.

FIGS. 1A to 1D show a conventional program method of a flash memory device. Each threshold voltage interval that a memory cell may have sorted into an erase state, a PV1 state, a PV2 state and PV3 state, and data value of 2 bit (multi bit) is defined to each state. A lower bit of data values of 2 bit refers to as a low page, and a higher bit refers to as a high page. A program operation of the low page refers to as a low page program "LSB program", and a program operation of the high page refers to as a high page program "MSB program".

The programming sequence of the multi line chip MLC will be described.

Figure 1A:
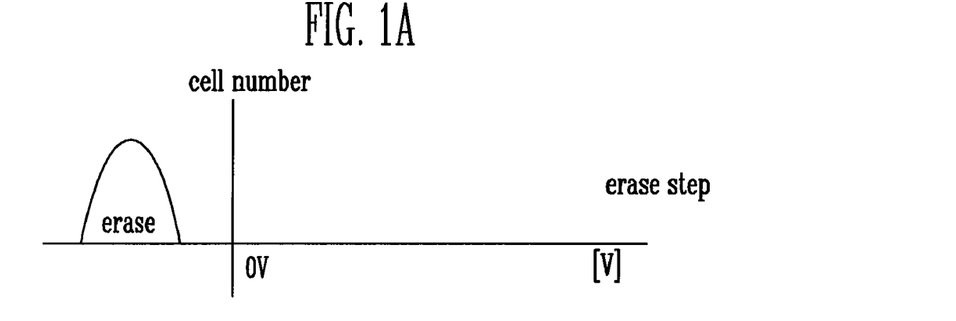
FIGS. 1A to 1D illustrate a conventional method of programming a flash memory, respectively.

Firstly, in memory cell array configured by a unit of block, all of the memory cells of the selected blocks are erased (FIG. 1A). Subsequently, a low page program LSB operation is performed.

Figure 1B:
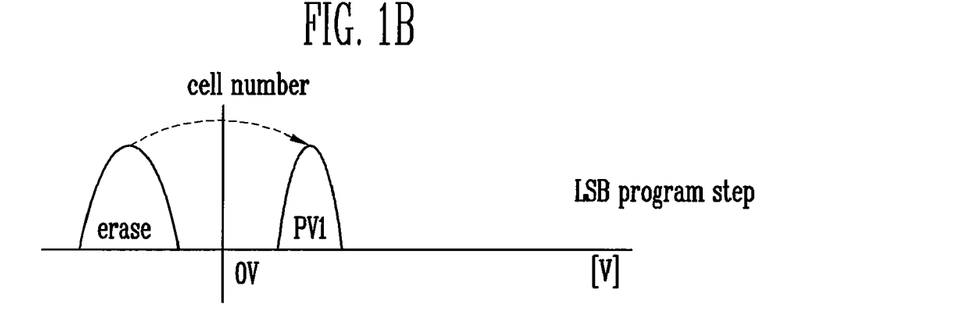

In the low page program LSB operation, among memory cells of erase states, a ground voltage is applied to the bit lines of the selected memory cells and a source voltage is applied to the bit lines of the non-selected memory cells. The low page program LSB operation is performed in such a way that a program voltage is applied to the selected word lines and a pass voltage is applied to the non-selected word lines. Accordingly, through these procedures of the low page program LSB operation, the selected memory cells of erase states become PV1 state (FIG. 1B).

The high page program MSB operations may be sorted into a first high page program MSB and a second high page program MSB.

Figure 1C:
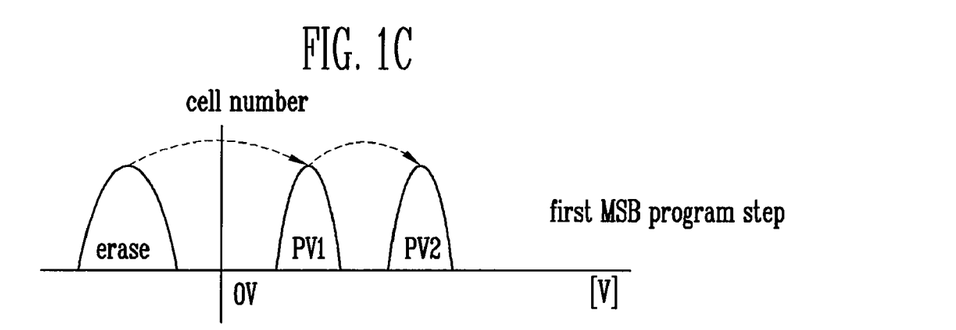

The first high page program MSB operation is an operation for programming the selected memory cells into the PV2 state. To program the erased memory cells into the PV2 state, the selected memory cells are LSB-programmed to the PV1 state from the erase state and then the first MSB program is performed thereto to make the selected memory cells be in PV2 state (FIG. 1C).

Figure 1D:
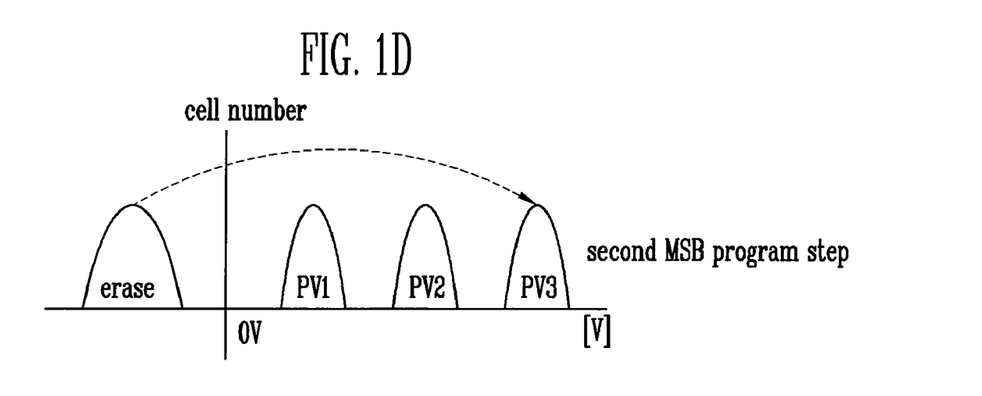

The second high page program MSB operation is an operation for programming the selected memory cells into the PV3 state (FIG. 1D). The second high page program MSB is performed in such a way that among memory cells of erase states, a ground voltage is applied to the bit lines of the selected memory cells and a program voltage is applied to the word lines connected to the selected memory cells.

A program operation speed of the multi level chip MLC may be reduced since each program operation has to be performed to program cells from erase states to the respective programmed state (PV 1 state, PV2 state or PV3 state).

BRIEF SUMMARY OF THE INVENTION

According to the present invention, in a program operation of a multi level chip having various intervals of program threshold voltages, different voltages between the threshold voltages are applied to the bit lines and thus the program operation having different threshold voltage intervals can be performed at the same time. Accordingly, the operation frequency of program can be decreased to reduce program operation time.

A program method of a flash memory device according to one embodiment of the present invention, comprises performing a first program for programming cells to a first state and a second state higher than the first state, and performing a second program simultaneously together with the first program, for programming cells to the second state and a third state higher than the second state.

The first program is performed for the selected cells among the cells of erase states to be the first state.

The selected cells are the cells which will be programmed to the first state and second state, and when performing the first program, the cells which will be programmed to the second state is programmed simultaneously to the first state together with the cells which will be programmed to the first state.

The second program is performed for programming the selected cells among the cells of erase states to the third state, and at the same time programming the cells which will be programmed to the second state among the first programmed cells, to the second state.

When performing the second program, a positive voltage is applied to the bit lines connected to the cells to be programmed to the second state.

The positive voltage of difference between a threshold voltage of the second state and a threshold voltage of the third state is applied.

A method of programming a flash memory device that has a erase state, a first state, a second state and a third state, according to another embodiment of the present invention, the method comprises performing a first program such that some of the first memory cells of erase states become to the second memory cell of the first state, and performing a second program in such a way that a ground voltage is applied to the first bit lines connected to the strings including the first memory cells, a positive voltage is applied to the second bit line connected to the strings including the second memory cells so that the first memory cells become the third memory cells of the second state and the second memory cells become the fourth memory cells of the third state.

In the second state, the threshold voltage becomes higher than that of the first state by the second program operation, and in the third state, the threshold voltage becomes higher than that of the second state by the second program operation.

The positive voltage is the voltage that is higher than the ground voltage, and is lower than a difference of threshold voltage between the program voltage applied to the selected bit line and the drain select transistor included in the string.

A method of programming a flash memory device according to another embodiment of the present invention comprises performing a first program for programming some of the erased cells to the first state and the second state higher than the first state, and performing a second program in such a way that a ground voltage is applied to the first bit line connected to the string including the selected memory cells for programming some of erased cells to the third state higher than the second state, and at the same time a positive voltage is applied to the second bit line connected to memory cells for programming cells that is first-programmed, to the second state.

The positive voltage of difference between the threshold voltages of the second state and third state is applied.

A flash memory device according to the present invention comprises a memory cell array on which data is stored, and page buffers that is connected to the memory cells through the bit lines and applies one of the first voltage, second voltage or third voltage between the first and second voltage, to the respective bit line when performing the program.

The first voltage is a source voltage and the second voltage is a ground voltage and the third voltage is a positive voltage.

The positive voltage of a difference between the threshold voltages of the second state and third state is applied.

The positive voltage is transmitted in such way that a turn voltage of the element transmitting voltage from the page buffer to the bit lines is not turned wholly but slightly.

An embodiment of the present invention will be explained with reference to the accompanying drawings. However, the invention is not limited to the disclosed embodiment. Additional advantages, objects, and features of the invention will be set forth in the description which follows and will become apparent to those having ordinary skill in the art upon examination of the following.

DESCRIPTION OF SPECIFIC EMBODIMENTS

Figure 2:
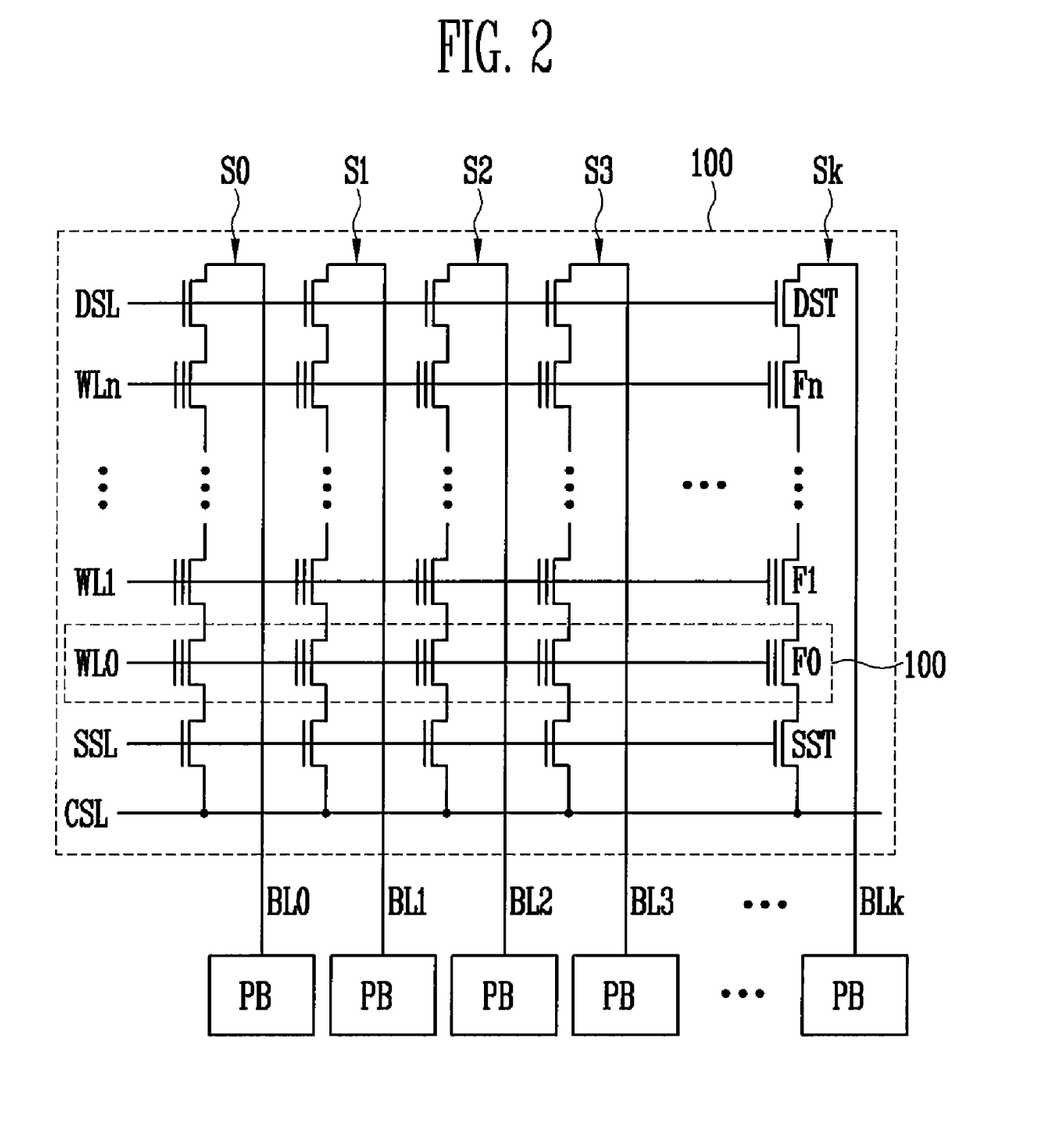
FIG. 2 is a circuit diagram showing a program method of a flash memory device according to the present invention.

FIG. 2 is a circuit diagram showing a program method of a flash memory device according to the present invention.

With reference to FIG. 2, one cell block 100 constituting a memory cell array and page buffers connected thereto are shown. The cell block 100 includes a plurality of strings $S_0$ to $S_k$. Each string is configured in such a way that a drain select transistor DST, memory cells $F_0$ to $F_n$ and a source select transistor SST are connected in series. Each drain select transistor DST is connected to each of bit lines $BL_0$ to $BL_K$ to transmit voltages of the page buffer PB to the strings $S_0$ to $S_k$ or receive voltages of the page buffer PB from the strings $S_0$ to $S_k$. The respective source select transistor SST is connected to a common source line CSL. A plurality of memory cells $F_0$ to $F_n$ are arranged in series between the drain select transistor DST and the source select transistor SST.

A gate electrode of the drain select transistor DST shares the drain select lines DSL. Each gate electrode of the source select transistor SST shares the source select line SSL and is connected thereto.

The page buffer PB transmits voltages corresponding to the operations of program and erase to bit lines $BL_0$ to $BL_K$ when programming and erasing, and receives voltage applied from the bit lines $BL_0$ to $BL_K$ when reading.

In the present invention, in addition to a first voltage (i.e., 0V) and a second voltage (i.e., Vcc) that is produced in a typical program operation, a third voltage Vd between the first voltage and the second voltage is further produced. The third voltage Vd is a positive voltage between the first voltage and the second voltage, and it will be described with reference to FIG. 3.

Figure 3:
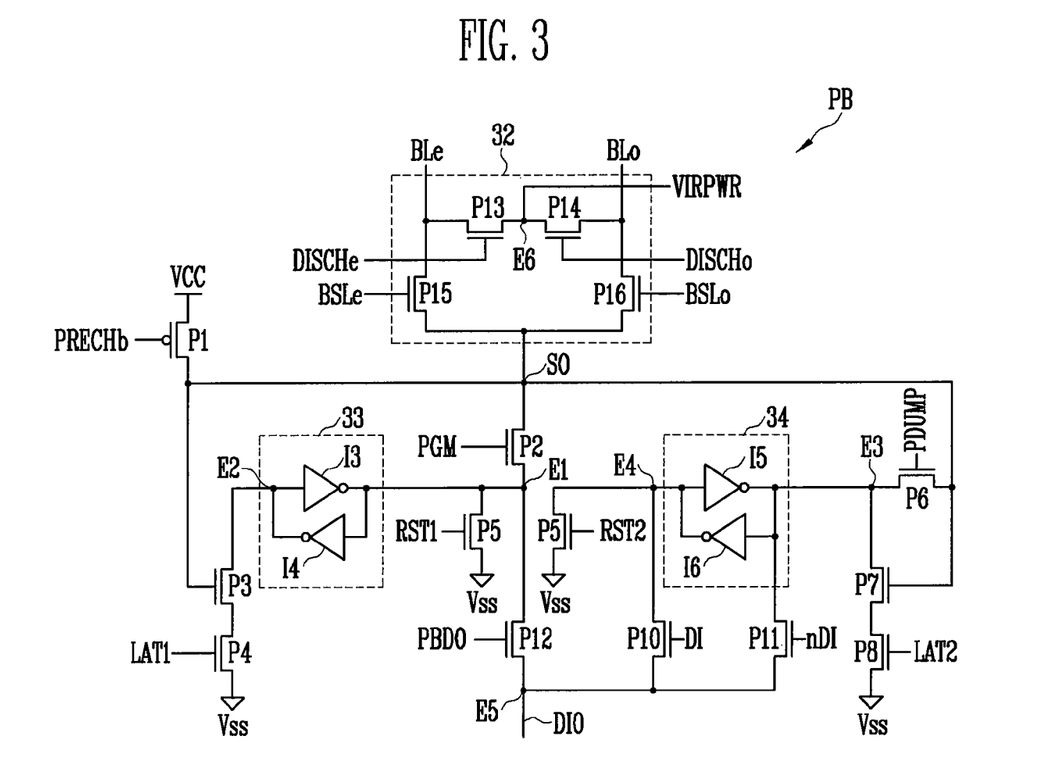
FIG. 3 is a circuit diagram showing a page buffer of FIG. 2.

FIG. 3 is a circuit diagram showing an operation of the page buffer of FIG. 2.

With reference to FIG. 3, even the page buffer PB used in the present invention is the page buffer that produces further the third voltage as described above, the configuration thereof is similar to that of a conventional page buffer PB. However, one of the first to third voltages can be transmitted selectively from the page buffer PB to the bit line BL by adjusting turn on voltage of some elements among the elements constituting the page buffer PB. For convenience of understanding, the page buffer PB will be described briefly referring to the FIG. 3.

The page buffer PB includes a select circuit 32 for selecting a plurality of bit lines and is configured in a dual latch design.

In more specific description, a precharge element P1 is implanted by a PMOS transistor that is operated in response to a precharge signal PRECHb, and is connected between a source voltage Vcc and a sensing node S0. A program element P2 is operated in response to a program signal PGM and is connected between the sensing nod S0 and a first node E1. A first control element P3 and a second control element P4 are connected in series between a second node E2 and a ground Vss, and the first control element P3 is operated in response to a voltage of the sensing node S0 and the second control element P4 is operated in response to a first latch signal LAT1.

A reset element P5 is operated in response to a first reset signal RST1 and is connected between the first node E1 and the ground Vss. A first latch 33 is connected between the first node E1 and the second node E2 and comprises two inverters I3, I4. A transmitting element P6 is operated in response to a transmitting signal PDUMP and is connected between the sensing node $S_0$ and the third node E3. A third control element P7 and a fourth control element P8 are connected in series between the third node E3 and the ground Vss, and the third control element P7 is operated in response to the voltage applied to the sensing node $S_0$ and the fourth control element P8 is operated in response to the second latch signal LAT2. A second reset element P9 is operated in response to a second reset element RST2 and is connected between a fourth node E4 and the ground Vss. A second latch 34 is connected between the third node E3 and the fourth node E4, includes two inverters I5, I6. The data inputted to the second latch 34 is stored thereon according to the operations of a first input element P10 and a second input element P11. The first input element P10 is operated in response to a first input signal DI and is connected between the fourth node E4 and a fifth node E5. The second input element P11 is operated in response to a second input signal nDI and is connected between the third node E3 and a fifth node E5. An input and output element P12 is operated in response to a input and output signal PBDO and is connected between the first node E1 and the fifth node E5, and the fifth node E5 is connected to a input and output line DI0.

The select circuit 32 includes an even charge element P13, an odd charge element P14, an even select element P15 and an odd select element P16 for connecting the bit lines BLe, BLo to the page buffer PB. The even charge element P13 and the odd charge element P14 is connected in series between bit lines BLe, BLo through the sixth node E6. The even charge element P13 is operated in response to an even charge signal DISCHe and in connected between the even bit line BLe and the sixth node E6, the odd charge element P14 is operated in response to an odd charge signal DISCHo and is connected between the odd bit line BLo and sixth node E6. A charge voltage VIRPWR is applied to the sixth node E6. The even select element P15 is operated in response to a even select signal BSLe and is connected between the sensing node S0 and the even bit line BLe. The odd select element P16 is operated in response to an odd select signal BSLo and is connected between the sensing node So and the odd bit line BLo.

While operating program, if the program signal PGM is activated, the program element P2 is turned on and thus the voltage of the first latch 33 is transmitted to the sending node So. The voltage transmitted to the sensing node So is transmitted to the even bit line BLe or the odd bit line BLo through the even select element P15 or the odd select element P16 of the select circuit 32.

In the other hands, when a third voltage is transmitted to the even or odd bit line BLe or BLo, if the program element P2 is turned on not wholly but slightly and the select signal selected BSLe or BSLo is activated, the third voltage, which is positive voltage between the first voltage and second voltage, can be outputted to the bit line. Additionally, if the program signal PGM is activated and the select signal selected BSLe or BSLo is turned on slightly, the third voltage can be outputted to the bit line. At this time, it is preferable that a program operation is performed in a state of the voltage of bit line BLe or BLo being 0V.

Subsequently, the program method according to the present invention will be described in detail referring to one page 110 of FIG. 2.

Figure 4:
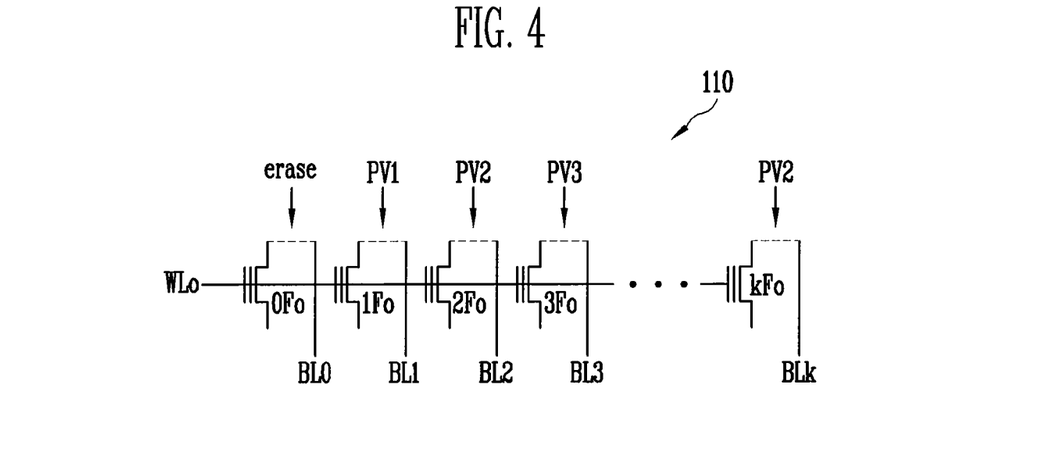
FIG. 4 is a circuit diagram showing a part of FIG. 2 to explain a program method of a flash memory device according to the present invention.

FIG. 4 is a circuit diagram showing a part of FIG. 2 to explain a program method of a flash memory device according to the present invention. According to one aspect of the present invention, among the memory cells $0F_0$ to $kF_0$ in the selected page, it is programmed such that a $0^{th}$ cell $0F_0$ is an erase state, a first cell $1F_0$ is the PV1 state, a second cell $2F_0$ is the PV2 state, a third cell $3F_0$ is the PV3 state and a $k^{th}$ cell $kF_0$ is the PV3 state. At this time, the erase state, PV1 state, PV2 state and PV3 state refer to as 11, 10, 00 and 01, respectively. However, this can be changed depending on definitions thereof, and in the present invention, depending on the order of increasing the threshold voltage, the program states are defined as a erase state, a PV1 state, a PV2 state and a PV3 state. The examples thereof will be described with reference to FIGS. 5A to 5F.

FIGS. 5A to 5F show a program method of a flash memory device according to the present invention in sequence.

Figure 5A:
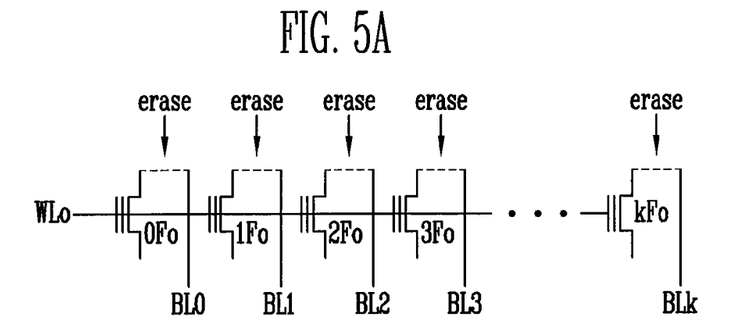
FIGS. 5A to 5F show a program method of a flash memory device according to the present invention in sequence.
Figure 5B:
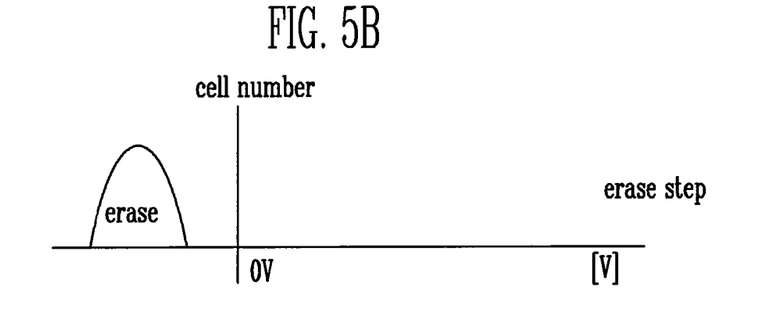

Referring to FIG. 5A, before performing a program operation, an erase operation is performed by a unit of cell block so that memory cells (all memory cell of cell block including memory cell $0F_0$ to $kF_0$) become a first memory cell of an erase state. The erase operation is performed such that the first voltage (i.e., 0V) is applied to a selected word line WL0 and the second voltage (i.e., Vcc) is connected to the all bit lines BLo to BLk. According to the erase operation, a threshold voltage distribution becomes an erase state (FIG. 5B).

Figure 5C:
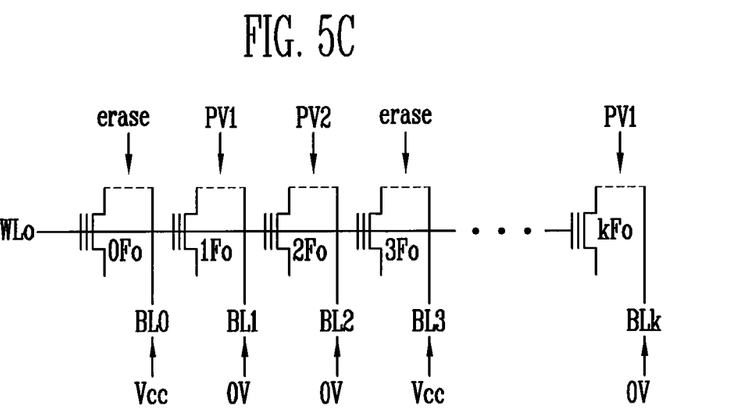

Referring to FIG. 5C, a first program operation as a low page program LSB operation is performed for programming the first cell ($1F_0$) to be the second memory cell of PV1 state. At this time, the low page program LSB operation is performed simultaneously to the second and $K^{th}$ cells $2F_0$ and $KF_0$, which is to be programmed for being PV2 state, to become PV1 state.

Figure 5D:
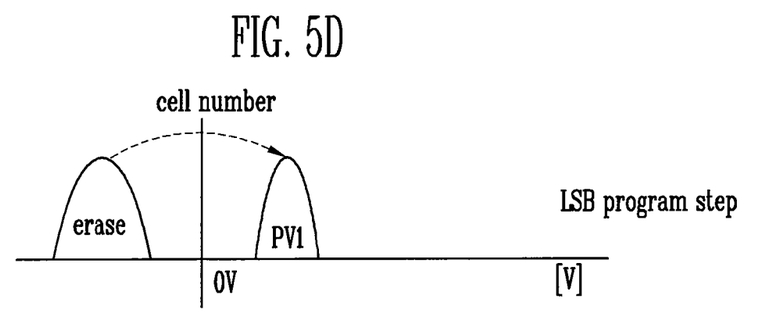

In more details, while the low page programming LSB, a program voltage is applied to the selected word line WL0, and the first voltage (i.e., 0V) is applied to the selected bit lines BL1, BL2 and BLk and the second voltage (i.e., Vcc) is applied to the non-selected bit lines BL0 and BL3. As a result, the $0^{th}$ cell ($0F_0$) keeps the erase state, and the first cell ($1F_0$), second cell ($2F_0$) and $K^{th}$ cell ($kF_0$) become the PV1 state (FIG. 5D).

Figure 5E:
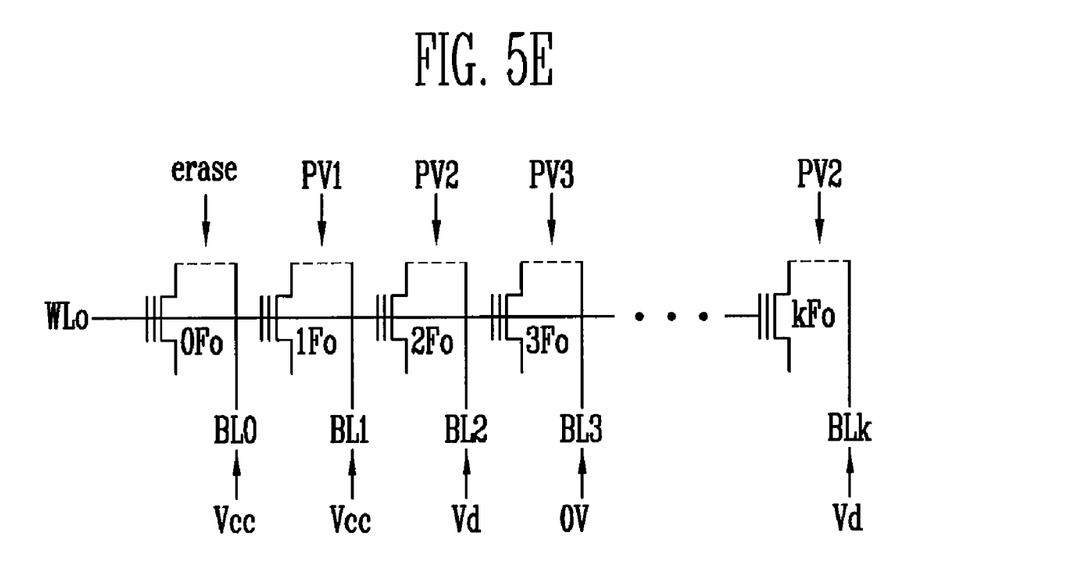

Referring to FIG. 5E, a second program operation as a high page program MSB operation is performed to program the third cell ($3F_0$) to become the PV3 state. At the same time, the second cell $2F_0$ and the $K^{th}$ cell $KF_0$ are programmed to be the PV2 state. More detailed description thereof is as follows.

Figure 5F:
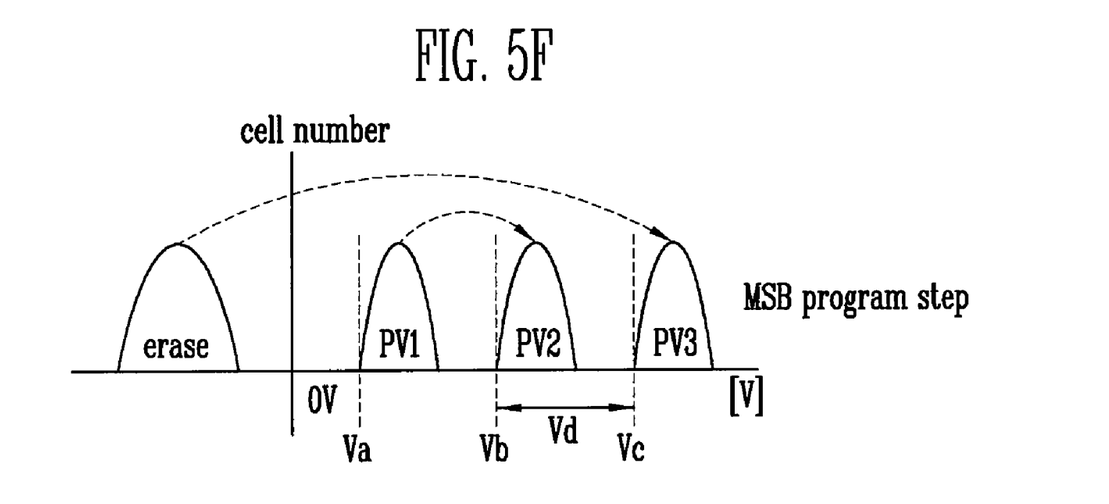

A program voltage is applied to the selected word line WL0 and the first voltage (i.e., 0V) is applied to the bit line BL3 connected to the third cell $3F_0$ for programming the third cell $3F_0$ so as to be the PV3 state. At the same time, the third voltage Vd is applied to the bit line BL2 connected to the second cell $2F_0$ for programming the second cell to be the PV2 state having the threshold voltage distribution higher than the PV1 state and lower than the PV2 state (FIG. 5F).

At this time, if a verify voltage of the PV1 state refers to Va, a verify voltage of the PV2 state refers to Vb and a verify voltage of the PV3 state refers to Vc, it is preferable that the third voltage Vd as much as voltage difference of Vc and Vb is applied, since the threshold voltage of the PV2 state has to be distributed between the threshold voltages of the PV1 state and PV3 state.

There may be various factors determining the threshold voltage distributions, however, it is mainly dependent on the amount of electrons stored on a floating gate. The amount of electrons stored on a floating gate can be determined by a voltage difference between word lines and a semiconductor substrate.

If the program voltage is applied to word lines and a ground voltage is applied to a channel of a semiconductor substrate through bit lines, a coupling phenomenon between a control gate and a floating gate by the program voltage is produced. This coupling phenomenon induces a tunneling phenomenon through which electrons flow to the floating gate from the semiconductor substrate, and a threshold voltage of the programmed cell can be varied dependent on the amount of tunneled electrons. Accordingly, an important factor determining the threshold voltage of the programmed cell is a voltage difference between the program voltage applied to the word line and the voltage applied to the bit line. With respect to this, a detailed description will be given as follows referring to a graph.

Figure 6:
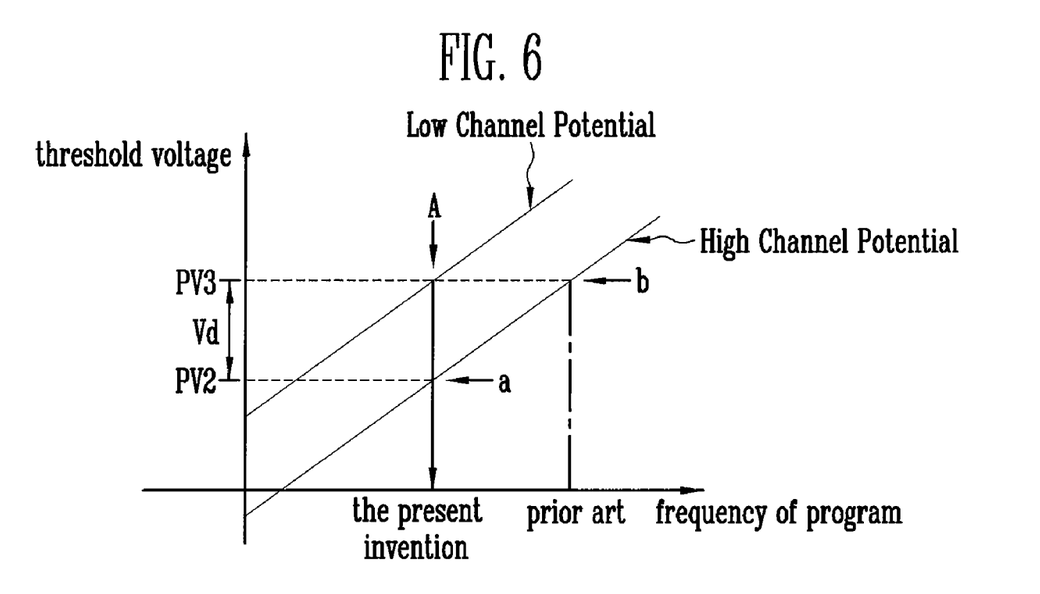
FIG. 6 is a graph comparing program frequencies of a flash memory device between the present invention and the prior art.

FIG. 6 is a graph comparing program frequencies of a flash memory device between the present invention and the prior art.

With reference to FIG. 6, x axe indicates a program frequency and y axe indicates a threshold voltage. In the prior art, for programming to be the PV3 state, firstly a program operation (a) is performed to reach the PV2 state, and then a program operation (b) has to be performed further to raise the threshold voltage to the PV3 state.

However, in the present invention, the voltage Vd as same as difference of threshold voltages of the PV2 state and PV3 state is applied to the bit lines simultaneously that are connected to the cell which will be programmed to become the PV2 state and thus through only one program operation (A) the program of the PV2 state and PV3 state can be performed to reduce a program operation time.

It will be apparent to those skilled in the art that various modifications and variations can be made in the present invention. Thus, it is intended that the present invention covers the modifications and variations of this invention provided they come within the scope of the appended claims and their equivalents.

In the present invention, when performing a program operation of a multi level chip having a plurality of threshold voltage intervals, different voltages as same as difference of threshold voltages are applied to bit lines and thus a program operation of cell having different threshold voltage intervals can be performed at the same time. Accordingly, the frequency of a plurality of program operation can be decreased to reduce program operation time.

What is claimed is:

1. A method of programming a flash memory device comprising:
    performing a first program for programming cells to a first state and a second state higher than the first state; and
    performing a second program simultaneously together with the first program, for programming cells to the second state and a third state higher than the second state.

2. The method according to claim 1, wherein the first program is performed for the selected cells among the cells of erase states to be the first state.

3. The method according to claim 2, wherein the selected cells are the cells which will be programmed to the first state and second state.

4. The method according to claim 1, wherein when performing the first program, the cells which will be programmed to the second state is programmed simultaneously to the first state together with the cells which will be programmed to the first state.

5. The method according to claim 1, wherein the second program is performed for programming the selected cells among the cells of erase states to the third state, and at the same time programming the cells which will be programmed to the second state among the first programmed cells, to the second state.

6. The method according to claim 1, wherein when performing the second program, a positive voltage is applied to the bit lines connected to the cells to be programmed to the second state.

7. The method according to claim 6, wherein the positive voltage of difference between a threshold voltage of the second state and a threshold voltage of the third state is applied.

8. A method of programming a flash memory device that has one of a erase state, a first state, a second state and a third state, the method comprising:
    performing a first program such that some of the first memory cells of erase states become to the second memory cell of the first state; and
    performing a second program in such a way that a ground voltage is applied to the first bit lines connected to the strings including the first memory cells, a positive voltage is applied to the second bit line connected to the strings including the second memory cells so that the first memory cells become the third memory cells of the second state and the second memory cells become the fourth memory cells of the third state.

9. The method according to claim 8, wherein in the second state, the threshold voltage becomes higher than that of the first state by the second program operation, and in the third state, the threshold voltage becomes higher than that of the second state by the second program operation.

10. The method according to claim 8, wherein the positive voltage is the voltage that is higher than the ground voltage, and is lower than a difference of threshold voltage between the program voltage applied to the selected bit line and the drain select transistor included in the string.

11. A method of programming a flash memory device comprising: performing a first program for programming some of the erased cells to a first state and a second state higher than the first state; and
    performing a second program in such a way that a ground voltage is applied to the first bit line connected to the string including the selected memory cells for programming some of erased cells to a third state higher than the second state, and at the same time a positive voltage is applied to the second bit line connected to memory cells for programming cells that is first-programmed, to the second state.

12. The method according to claim 11, wherein the positive voltage of difference between the threshold voltages of the second state and third state is applied.

* * * * *